(12) United States Patent
Ueno et al.

(10) Patent No.: US 7,046,490 B1
(45) Date of Patent: May 16, 2006

(54) SPIN VALVE MAGNETORESISTANCE SENSOR AND THIN FILM MAGNETIC HEAD

(75) Inventors: Masaki Ueno, Osaka (JP); Hideyasu Nagai, Osaka (JP); Koichi Suzuki, Osaka (JP); Tomoki Fukagawa, Osaka (JP); Fuminori Hikami, Osaka (JP)

(73) Assignee: Western Digital (Fremont), Inc., Fremont, CA (US)

( * ) Notice: Subject to any disclaimer, the term of this patent is extended or adjusted under 35 U.S.C. 154(b) by 884 days.

(21) Appl. No.: 09/479,267

(22) Filed: Jan. 6, 2000

(51) Int. Cl.
*G11B 5/39* (2006.01)

(52) U.S. Cl. .............................. 360/324.11

(58) Field of Classification Search ............. 360/313, 360/314, 315, 316, 317, 318, 318.1, 319, 360/320, 321, 322, 323, 324, 324.1, 324.11, 360/324.2, 325, 326, 327, 327.1, 327.11, 360/327.2, 327.21, 327.22, 327.23, 327.24, 360/324.3, 327.31, 327.32, 327.33, 126; 428/611
See application file for complete search history.

(56) References Cited

U.S. PATENT DOCUMENTS

| | | | | |
|---|---|---|---|---|
| 5,549,978 A | * | 8/1996 | Iwasaki et al. | 428/692 |
| 5,648,885 A | * | 7/1997 | Nishioka et al. | 324/252 |
| 5,764,445 A | * | 6/1998 | Torng et al. | 360/327.32 |
| 5,780,176 A | * | 7/1998 | Iwasaki et al. | 428/692 |
| 5,796,560 A | * | 8/1998 | Saito et al. | 360/324 |
| 5,850,323 A | * | 12/1998 | Kanai | 360/324.11 |
| 5,874,886 A | * | 2/1999 | Araki et al. | 338/32 R |
| 5,991,125 A | * | 11/1999 | Iwasaki et al. | 360/324.12 |
| 6,046,892 A | * | 4/2000 | Aoshima et al. | 360/324.11 |
| 6,074,743 A | * | 6/2000 | Araki et al. | 428/332 |
| 6,157,525 A | * | 12/2000 | Iwasaki et al. | 360/324.1 |
| 6,175,476 B1 | * | 1/2001 | Huai et al. | 360/324.11 |

FOREIGN PATENT DOCUMENTS

JP   8-315326   * 11/1996

* cited by examiner

*Primary Examiner*—Brian E. Miller
(74) *Attorney, Agent, or Firm*—Burgess & Bereznak LLP; Joshua C. Harrison, Esq.

(57) ABSTRACT

A spin valve magnetoresistance sensor of a thin film magnetic head. In one embodiment, a spin valve magnetoresistance sensor is provided with a spin valve film, in which a base layer including a first base film of Ta or some other nonmagnetic metal and, on top of this, a second base film of an alloy represented by NiFeX (where X is at least one element selected from among Cr, Nb, Rh) is formed on a substrate, and on top of this are formed by layering a free magnetic layer and pinned magnetic layer arranged to enclose a nonmagnetic conductive layer, as well as an antiferromagnetic layer, the second base film has an fcc (face-centered cubic) structure and also has a (111) orientation.

4 Claims, 2 Drawing Sheets

SPIN VALVE MAGNETORESISTANCE SENSOR AND THIN FILM MAGNETIC HEAD

BACKGROUND OF THE INVENTION

1. Field of the Invention

This invention concerns a magnetoresistance sensor used in magnetic recording devices, and in particular a magnetic sensor and thin film magnetic head utilizing the spin valve magnetoresistance effect.

2. Background Information

In recent years, magnetic sensors have been developed which consist of a sandwich-structure spin valve film formed by layering a pair of magnetic layers enclosing a nonmagnetic layer on a substrate, in order to reduce the saturation magnetic field and raise the magnetic field sensitivity in magnetic heads for reproduction. In a spin valve film, whereas the magnetization in one of the magnetic layers (the pinned layer) is fixed in the direction of the element height by the exchange-coupling magnetic field with the adjacent antiferromagnetic layer, the other magnetic layer (the free layer) is generally given a single-domain structure in the track width direction of the element by a hard bias method using the magnetic field of a permanent magnet, and the magnetization rotates freely under the action of an external magnetic field.

The larger the unidirectional anisotropic magnetic field due to the antiferromagnetic layer, the better the single-domain structure of the pinned layer, and the more securely its magnetization is fixed, the more secure the linear magnetic response to an external magnetic field, so that the magnetic characteristics of the magnetic sensor are improved. Hence in the past various antiferromagnetic materials have been proposed. And, it is known that the characteristics of the antiferromagnetic material change depending on the material of the base layer.

For example, in unexamined patent application Hei8-315326, a magnetoresistance effect head is disclosed in which, by employing a crystalline soft magnetic film which has high resistance and can improve alignment as the base layer of a magnetoresistance effect film, the relative magnetoresistive change and other characteristics can be improved. Further, in this patent application is described the provision of Ta or some other nonmagnetic metal film as the base in order to improve the crystallinity of the aforementioned crystalline soft magnetic film. Further, a magnetoresistance sensor described in unexamined patent application Hei8-213238 uses a Ta base layer in order to render uniform the crystal orientation of the magnetic free layer.

Moreover, in unexamined patent application Hei9-16915 is disclosed the fact that by using a two-layer film of a Ta film and an NiFe-system alloy film as the base layer in a spin valve magnetoresistance transducer, the crystallinity of the antiferromagnetic layer is improved, and the magnetization of the pinned layer is sufficiently fixed so that a linear magnetoresistive change can be obtained. Moreover, in unexamined patent application Hei6-325934 is described how, in a magnetoresistance effect element, by means of a base layer with a two-layer structure in which a second base film of Ta or similar is placed between a first base film of a material with an fcc (face-centered cubic) lattice and the substrate, the (111) orientation of the ferromagnetic film formed on top is improved, while at the same time the surface smoothness can be enhanced.

However, for a spin valve film of the prior art provided with a base layer comprising a Ta film, the unidirectional anisotropy magnetic field due to the antiferromagnetic layer is normally limited to between 200 and 1000 Oersteds (Oe), so that when applied to a magnetic head, if the operating temperature rises the magnetization direction of the pinned layer changes, the magnetic transducing characteristics become unstable, and reliability suffers.

There is the further problem that, if the free layer in a spin valve magnetoresistance sensor is made thin, the reproduction output can be raised, but if the thickness is reduced below a certain limit (approximately 30 to 40 Å), the (111) orientation of the free layer becomes inadequate, the ferromagnetic interaction between the free layer and pinned layer is increased, so that the reproduction output declines rather than increasing and the sensor becomes magnetically unstable. For this reason the thickness of the free layer is normally set in the range from approximately 50 to 100 Å; but in order to raise the reproduction output, it is desirable that the thickness of the free layer be decreased as much as possible while maintaining magnetic stability.

SUMMARY OF THE INVENTION

A spin valve magnetoresistance sensor is disclosed. In one embodiment, the spin valve magnetoresistance sensor includes a base layer layered on top of a substrate. The base layer includes a first base film and a second base film formed on top of the first base film. The first base film includes a nonmagnetic metal. The second base film includes an alloy represented by NiFeX, where X includes one of Cr, Nb and Rh. The second base film has a face-centered cubic (fcc) structure and a (111) orientation. The spin valve magnetoresistance sensor also includes a pair of magnetic layers enclosing a nonmagnetic layer layered on top of the base layer and an antiferromagnetic layer adjacent to one of the pair of magnetic layers.

BRIEF DESCRIPTION OF THE DRAWINGS

The present invention detailed illustrated by way of example and not limitation in the accompanying figures.

EXPLANATION OF SYMBOLS

Figure 1:
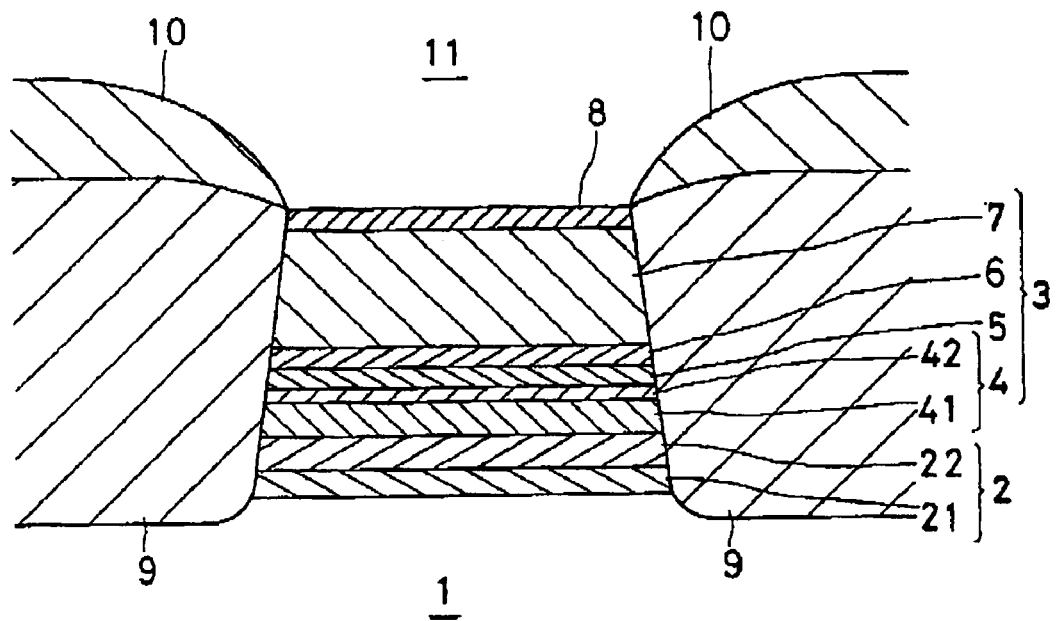
FIG. 1 is a cross-sectional diagram, seen from the ABS side, of a preferred embodiment of a spin valve magnetoresistance sensor of this invention.

1 Insulating layer
2 Base layer
3 MR film
4 Free magnetic layer
5 Nonmagnetic conducting layer
6 Pinned magnetic layer
7 Antiferromagnetic layer 8 Protective layer
9 Hard bias layer
10 Conductive lead
11 Alumina insulating layer
21 First base film
22 Second base film
41 Nickel-iron film
42 Cobalt-iron film

DETAILED DESCRIPTION

In one embodiment, the present invention increases the unidirectional anisotropy due to the antiferromagnetic film of the spin valve film, and decreases the interaction between the free layer and pinned layer. In addition, one embodiment of the present invention provides a spin valve magnetoresistance sensor with thermally and magnetically stabilized magnetic transducing characteristics. One embodiment of the present invention provides a high-performance thin film magnetic head which can be used at higher recording densities, through the provision of the spin valve magnetoresistance sensor.

One embodiment of the present invention provides a spin valve magnetoresistance sensor, provided with a spin valve film formed by layering on top of a substrate a base layer, a pair of magnetic layers enclosing a nonmagnetic layer on top of the aforementioned base layer, and an antiferromagnetic layer adjacent to one of the aforementioned magnetic layers, and characterized by the facts that the aforementioned base layer consists of a first base film of a nonmagnetic metal and a second base film of an alloy represented by NiFeX (where X is at least one element selected from among Cr, Nb, Rh) formed on top of the aforementioned first base film, and that the aforementioned second base film has an fcc (face-centered cubic) structure and a (111) orientation.

By forming both magnetic layers, the nonmagnetic layer and the antiferromagnetic layer of the spin valve film on top of such a second base film, the (111) crystal plane orientation is strengthened, and the unidirectional anisotropic magnetic field is strengthened while the interaction magnetic field between the two magnetic layers is weakened. A spin valve magnetoresistance sensor is obtained which exhibits high relative magnetoresistive change and linear magnetoresistive change.

The crystal orientation of the spin valve film cannot be improved beyond a certain extent even if the thickness of the base layer is excessively increased. A thickness for the second base film in the range from 20 to 100 Å is desirable.

Further, by appropriately selecting the concentration of the element X contained in the NiFeX of the base layer, the nonmagnetic behavior can be enhanced compared with NiFe alloy, and moreover the electrical resistance can be increased to greatly reduce the shunt current flowing in the base layer, so that the relative magnetoresistive change of the sensor can be increased. In particular, if the element X is Cr, and if its content is within the range from 20 to 50 at %, then the magnetism of the NiFe which is a component of the second base film disappears to make the film nonmagnetic, which is desirable.

As a separate aspect of this invention, a thin film magnetic head is provided which has high thermal and magnetic stability and can be used at high recording densities, by means of being equipped with the above-mentioned spin valve magnetoresistance sensor.

FIG. 1 shows a preferred embodiment of a spin valve magnetoresistance sensor which employs this invention. In this spin valve magnetoresistance sensor, the base layer 2 is formed on top of an alumina ($Al_2O_3$) insulating layer 1 provided on a substrate consisting of glass, silicon, $Al_2O_3$.TiC or other ceramic material, and on top of this is formed by layering the magnetoresistance (MR) film 3 with a spin valve structure. The base layer 2 of this embodiment has a two-layer structure of a first base film 21, consisting of tantalum (Ta) 30 Å thick, and a second base film 22, consisting of nickel-iron-chromium (NiFeCr) 50 Å thick.

The MR film 3 has a free magnetic layer 4 consisting of a two-layer structure of a nickel-iron (NiFe) film 41 of thickness 50 Å and a cobalt-iron (CoFe) film 42 of thickness 10 Å, formed by layering on the base layer 2; a nonmagnetic conducting layer 5 consisting of a copper (Cu) film of thickness 25 Å; a pinned magnetic layer 6 consisting of a cobalt-iron (CoFe) film of thickness 20 Å; and an antiferromagnetic layer 7 consisting of a platinum-manganese (PtMn) film of thickness 300 Å. On top of the MR film 3 adheres a protective layer 8 consisting of a Ta film of thickness 30 Å.

Both sides of the MR film 3 are removed by etching according to the prescribed track width, and a hard bias layer 9 is formed. On top of the hard bias layer 9 is formed a pair of conducting leads 10 as electrodes to pass a sense current, and this entire layered structure is covered with an alumina insulating layer 11 to complete the spin valve MR sensor of this invention.

By subjecting the MR film 3 to prescribed heat treatment in vacuum in a magnetic field after film deposition, the antiferromagnetic layer 7 is ordered, and a unidirectional anisotropy is imparted to the pinned magnetic layer 6, to fix its magnetization orientation. The NiFeCr second base film 22 has an fcc crystal structure, and has a (111) orientation, so that the (111) orientation of each of the layers of the MR film 3 formed by layering on top can be enhanced. The unidirectional anisotropy magnetic field due to the antiferromagnetic layer 7 of the aforementioned MR film is increased, and the interaction magnetic field between the free magnetic layer 4 and pinned magnetic layer 6 is reduced.

A Cr concentration in the aforementioned NiFeCr film in the range from 20 to 50 at % is desirable in order to render the second base film 22 nonmagnetic and to increase its electrical resistance. The thickness of the second base film 22 is not limited to the above-mentioned 50 Å, but can be set appropriately within the range from 20 to 100 Å. As the material for the aforementioned second base film, an element other than Cr such as Nb or Rh can be added to NiFe to form an NiFe system alloy. In any of these cases, by selecting a composition with a high resistivity, the shunt current in the base layer can be suppressed, so that a large relative magnetoresistive change is obtained.

The aforementioned two magnetic layers can be formed from various well-known ferromagnetic materials such as Co or CoFeB in addition to the aforementioned NiFe and CoFe, and the aforementioned antiferromagnetic layer can employ various antiferromagnetic materials in addition to the above-mentioned PtMn, such as widely known PdPtMn system, NiMn system, IrMn system, RhMn system, FeMn system, or NiO system materials.

In a separate embodiment, in contrast to the embodiment of FIG. 1, the antiferromagnetic layer 7 can be formed on the substrate side and the free magnetic layer 4 on the side opposite the substrate, with the order of layering of each of the film layers reversed. In this case also, an effect similar to that of the embodiment of FIG. 1 is obtained. In addition, the aforementioned embodiments of this invention can be variously modified and altered in other ways within the technical scope of the invention.

Figure 2:
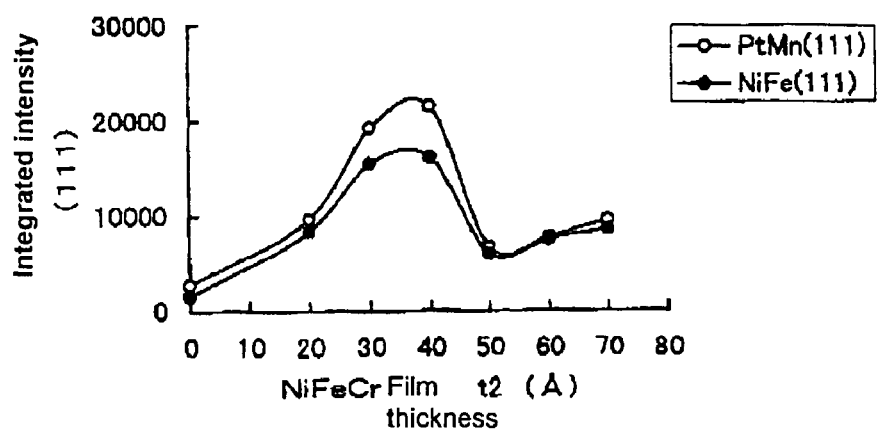
FIG. 2 is a line graph showing the X-ray diffraction profiles indicating the (111) orientations of the PtMn antiferromagnetic layer and the NiFe film of the free magnetic layer for different thicknesses of the NiFeCr second base film.

FIG. 2 shows the (111) orientation of the PtMn antiferromagnetic layer 7 and the NiFe film 41 of the free magnetic layer 4, for different film thicknesses t2 of the second base film 22 consisting of the composition $NiFe_{16}Cr_{25}$ in the embodiment of FIG. 1. From these X-ray diffraction profiles, we see that both the aforementioned film layers generally exhibit strong (111) orientation within the range $20 \leq t2 \leq 50$.

Figure 3A:
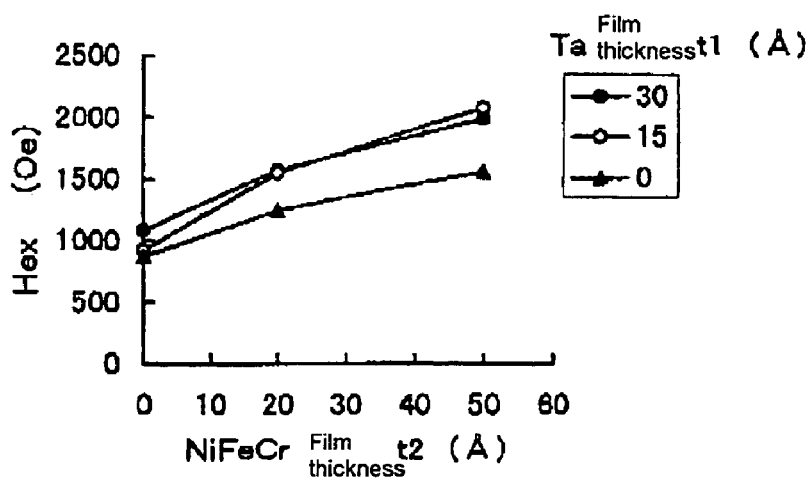
FIGS. 3A and 3B are line graphs showing changes in the exchange coupling magnetic field $H_{ex}$ and in the interaction magnetic field $H_{int}$ between the pinned and free layers, respectively, with changes in the thickness of the NiFeCr second base film.
Figure 3B:
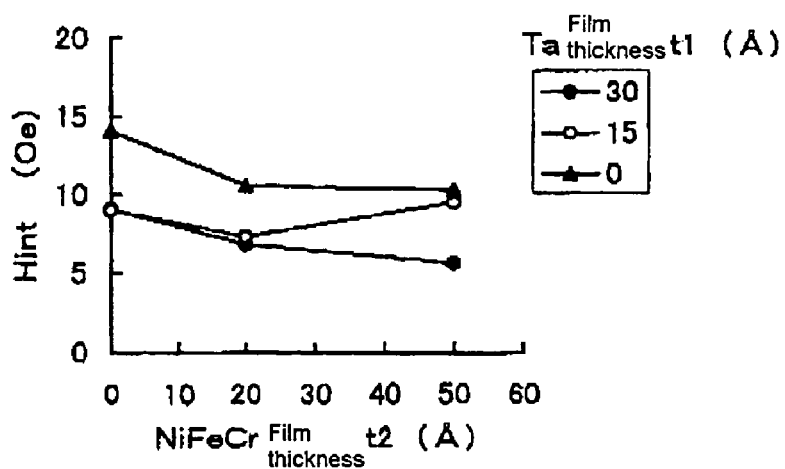

Further, changes in the exchange coupling magnetic field $H_{ex}$ and in the interaction magnetic field $H_{int}$ between the pinned and free layers with changes in the film thickness t2 of the second base film 22, with the same $NiFe_{16}Cr_{25}$ composition, were measured when the film thickness t1 of the Ta first base film 21 in the embodiment of FIG. 1 is 30 Å, 15 Å and 0 Å. The results shown in FIGS. 3A and 3B were obtained. FIG. 3A shows that the exchange coupling magnetic field $H_{ex}$ is generally large within the range $20 \leq t2 \leq 50$, regardless of the value of the film thickness t1, and therefore that the unidirectional anisotropy is large. On the other hand, FIG. 3B shows that the interaction magnetic field $H_{int}$ is generally small within the same range $20 \leq t2 \leq 50$.

Figure 4:
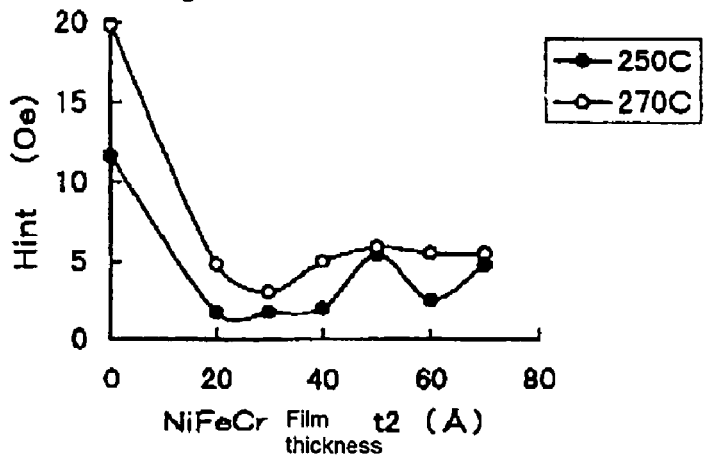
FIG. 4 is a line graph showing changes in the interaction magnetic field $H_{int}$ between the pinned and free layers with changes in the thickness of the NiFeCr second base film, when the MR film is heat treated at 250° C. and at 270° C.

Further, changes in the interaction magnetic field $H_{int}$ between the pinned and free layers with the film thickness t2 of the second base film 22 with the same $NiFe_{16}Cr_{25}$ composition were measured when, in the embodiment of FIG. 1, the film thickness t1 of the Ta first base film 21 is held constant and the MR film 3 is heat-treated at 250° C. and 270° C. The results shown in FIG. 4 were obtained. The figure shows that for both heat treatment temperatures, the interaction magnetic field $H_{int}$ is generally small within the range $20 \leq t2 \leq 70$. On the basis of these measurement results, the aforementioned effect of this invention was confirmed.

With the embodiments described above, the present invention has the advantageous results described below. In the spin valve magnetoresistance sensor of this invention, the (111) orientation of the spin valve film can be strengthened and its unidirectional anisotropy magnetic field increased due to the second base film, and the interaction magnetic field between the two magnetic layers can be reduced, so that high thermal and magnetic stability is obtained, and magnetic transducing characteristics can be improved, including a high relative magnetoresistive change and linear magnetoresistive change. Further, a magnetic head can be realized which has high thermal and magnetic stability and can be used at high recording densities.

What is claimed is:

1. A spin valve magnetoresistance sensor, comprising:
   a base layer layered on top of a substrate, the base layer including a first base film having a nonmagnetic metal and a second base film formed on top of the first base film, the second base film having an alloy represented by NiFeX, wherein X includes one of Cr, Nb and Rh, the second base film having a face-centered cubic (fcc) structure and a (111) orientation;
   a pair of magnetic layers enclosing a nonmagnetic layer layered on top of the base layer; and
   an antiferromagnetic layer adjacent to one of the pair of magnetic layers.

2. The spin valve magnetoresistance sensor described in claim 1 wherein a film thickness of the second base film is within a range of 20 to 100 Å.

3. The spin valve magnetoresistance sensor of claim 1 wherein X is Cr, wherein a content of Cr in the second base film is within a range of 20 to 50 at %.

4. The spin valve magnetoresistance sensor of claim 1 wherein the spin valve magnetoresistance sensor is included in a thin film magnetic head.

* * * * *